United States Patent
Mishra et al.

(10) Patent No.: US 9,853,842 B2
(45) Date of Patent: *Dec. 26, 2017

(54) CONTINUOUS TIME LINEAR EQUALIZATION FOR CURRENT-MODE LOGIC WITH TRANSFORMER

(71) Applicant: INPHI CORPORATION, Santa Clara, CA (US)

(72) Inventors: Parmanand Mishra, Thousand Oaks, CA (US); Steffen Nielsen, Newbury Park, CA (US); Michael S. Harwood, Rushden (GB)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/359,338

(22) Filed: Nov. 22, 2016

(65) Prior Publication Data

US 2017/0078120 A1    Mar. 16, 2017

Related U.S. Application Data

(63) Continuation of application No. 15/074,530, filed on Mar. 18, 2016, now Pat. No. 9,537,685, which is a continuation of application No. 14/679,934, filed on Apr. 6, 2015, now Pat. No. 9,325,319.

(51) Int. Cl.
   *H04L 25/03* (2006.01)
   *H03K 19/094* (2006.01)
   *H04L 25/02* (2006.01)

(52) U.S. Cl.
   CPC ..... *H04L 25/03057* (2013.01); *H03K 19/094* (2013.01); *H04L 25/0272* (2013.01); *H04L 25/03885* (2013.01)

(58) Field of Classification Search
   CPC ........... H04L 25/03057; H04L 25/0272; H04L 25/03885; H03K 19/094
   See application file for complete search history.

(56) References Cited

U.S. PATENT DOCUMENTS

| | | | |
|---|---|---|---|
| 6,777,988 B2 * | 8/2004 | Tung | H03K 3/356139 326/115 |
| 7,312,662 B1 * | 12/2007 | Roo | H03F 3/265 330/253 |
| 9,325,319 B1 * | 4/2016 | Mishra | H03K 19/094 |
| 9,537,685 B2 * | 1/2017 | Mishra | H03K 19/094 |

(Continued)

*Primary Examiner* — Leon Flores
(74) *Attorney, Agent, or Firm* — Richard T. Ogawa; Ogawa P.C.

(57) ABSTRACT

The present invention is directed to data communication systems and methods. More specifically, embodiments of the present invention provide a CML that uses one or more equalization modules to apply equalization via secondary windings of transformers that are coupled, directly or indirectly, to the CML outputs. The equalization modules comprises a DAC component that generates switching signals based on control signals received from an external equalization module. The equalization module also includes switchable resistors and/or capacitors. The switching signals are used to select switchable resistors and/or capacitors. By switching resistors and/or capacitors at the equalization module, the outputs of the CML are equalized. There are other embodiments as well.

20 Claims, 6 Drawing Sheets

(56) References Cited

U.S. PATENT DOCUMENTS

| | | | | |
|---|---|---|---|---|
| 2007/0063767 A1* | 3/2007 | Das | ............ | H03F 1/14 |
| | | | | 330/51 |
| 2014/0072025 A1* | 3/2014 | Matsudaira | ............ | H04L 27/01 |
| | | | | 375/232 |
| 2016/0099681 A1* | 4/2016 | Zong | ............ | H03B 5/1215 |
| | | | | 331/117 FE |

* cited by examiner

CONTINUOUS TIME LINEAR EQUALIZATION FOR CURRENT-MODE LOGIC WITH TRANSFORMER

CROSS-REFERENCES TO RELATED APPLICATIONS

The present application is a continuation of U.S. patent application Ser. No. 15/074,530 filed on Mar. 18, 2016, which is a continuation of U.S. patent application Ser. No. 14/679,934 filed on Apr. 6, 2015, the entire content of which is incorporated herein by reference.

BACKGROUND OF THE INVENTION

The present invention is directed to data communication systems and methods.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, current-mode logic (CML) is often used as a part of a communication interface.

Over the past, there have been many types of communication systems and methods. Unfortunately, they have been inadequate for various applications. More specifically, the CMLs of existing communication systems are often inadequate. Therefore, improved systems and methods are desired.

BRIEF SUMMARY OF THE INVENTION

The present invention is directed to data communication systems and methods. More specifically, embodiments of the present invention provide a CML that uses one or more equalization modules to apply equalization via secondary windings of transformers that are coupled, directly or indirectly, to the CML outputs. An equalization modules includes a digital-to-analog converter (DAC) component that generates switching signals based on control signals received from an external equalization module. The equalization module also includes switchable resistors and/or capacitors. The switching signals are used to select the switchable resistors and/or capacitors. By switching resistors and/or capacitors at the equalization module, the outputs of the CML are equalized. There are other embodiments as well.

According to an embodiment, the present invention provides a current mode logic device. The device includes a first input and a second input for receiving data. The device also includes a first transistor comprising a first gate and a first output terminal and a first source terminal. The first gate is electrically coupled to the first input. The device further includes a second transistor comprising a second gate and a second output terminal. The second gate is electrically coupled to the second input. The device also includes a capacitor module coupled to the first source terminal. The capacitor module includes a plurality of capacitors. The device further includes a first resistor coupled to the first output terminal and a second resistor coupled to the second output terminal. The device includes a first transformer comprising a first primary winding and a first secondary winding. The primary winding is electrically coupled to the first resistor and the first output terminal. The device additionally includes a first equalization module coupled to the first secondary winding. The first equalization module includes a first DAC unit and a first plurality of resistors. The first DAC unit is configured to selectively switching one or more of the first plurality of resistors in response to equalization signals received from an equalization logic.

According to another embodiment, the present invention provides a communication system. The system includes a first communication line and a second communication line. The system also includes an adaptive equalization module. The system also includes a CML coupled to the first communication line and the second communication line. The CML comprises a first input and a second input for receiving data. The first input is coupled to the first communication line. The second input is coupled to the second communication line. The CML also includes a first transistor comprising a first gate and a first output terminal and a first source terminal. The first gate is electrically coupled to the first input. The CML further includes a second transistor comprising a second gate and a second output terminal. The second gate is electrically coupled to the second input. The CML additionally includes a capacitor module coupled to the first source terminal. The capacitor module includes a plurality of capacitors. The CML also includes a first transformer comprising a first primary winding and a first secondary winding. The first primary winding is electrically coupled to the first output terminal. The CML also includes a first equalization module coupled to the first secondary winding. The first equalization module includes a first DAC unit and a first plurality of resistors. The first DAC unit is configured to selectively switching one or more of the first plurality of resistors in response to equalization signals received from the adaptive equalization module.

According to yet another embodiment, the present invention provides a current mode logic device. The device includes a first input and a second input for receiving data. The device also includes a first transistor comprising a first gate and a first output terminal, and the first gate is electrically coupled to the first input. The device also includes a second transistor comprising a second gate and a second output terminal. The second gate is electrically coupled to the second input. The device further includes a first resistor coupled to the first output terminal. The device also includes a second resistor coupled to the second output terminal. The device includes a first transformer comprising a first primary winding and a first secondary winding. The first primary winding is electrically coupled to the first resistor and the first output terminal. The device additionally includes a first equalization module coupled to the first secondary winding. The first equalization module includes a first DAC unit and a first plurality of capacitors. The first DAC unit is configured to selectively switching one or more of the first plurality of capacitors in response to equalization signals received from an equalization logic.

It is to be appreciated that embodiments of the present invention provide many advantages over conventional systems. Through using transformers coupled to the output of CML devices, equalization of the output peaking magnitude can be effectively applied without shifting peaking frequency. Additionally, since DACs are used to control the equalization modules coupled to the CML, embodiments of the present invention are compatible with a variety of equalization systems, including adaptive equalization schemes such as decision feedback equalization (DFE). Embodiments of the presentation can be provided using existing semiconductor manufacturing processes, and thus can be inexpensively implemented in a range of systems. There are other benefits as well.

DETAILED DESCRIPTION OF THE INVENTION

The present invention is directed to data communication systems and methods. More specifically, embodiments of the present invention provide a CML that uses one or more equalization modules to apply equalization via secondary windings of transformers that are coupled, directly or indirectly, to the CML outputs. An equalization modules includes a DAC component that generates switching signals based on control signals received from an external equalization module. The equalization module also includes switchable resistors and/or capacitors. The switching signals are used to select the switchable resistors and/or capacitors. By switching resistors and/or capacitors at the equalization module, the outputs of the CML are equalized. There are other embodiments as well.

Current mode logic, as mentioned above, has a wide range of applications. Among other features, CML provides fast operation and low power consumption, which makes it suitable for high-speed communication. For low-power and high-speed communication systems, such as optical communication network, CML can be used as a part of a device interface. In addition to being used in optical networks, CMLs have been used in various type of video links, such as HDMI, DVI, and others.

Used as buffers, CMLs have been implemented in tapered buffer chains, serializer-deserializer (SerDes) circuits, clock and data recover (CDR), multiplexers, and many others. With relatively low voltage swings, compared to static CMOS circuits, CML provides high-speed operation that is important for interface and communication applications. For example, CML can operates at a speed well over 200 Mbit/s.

Figure 1:
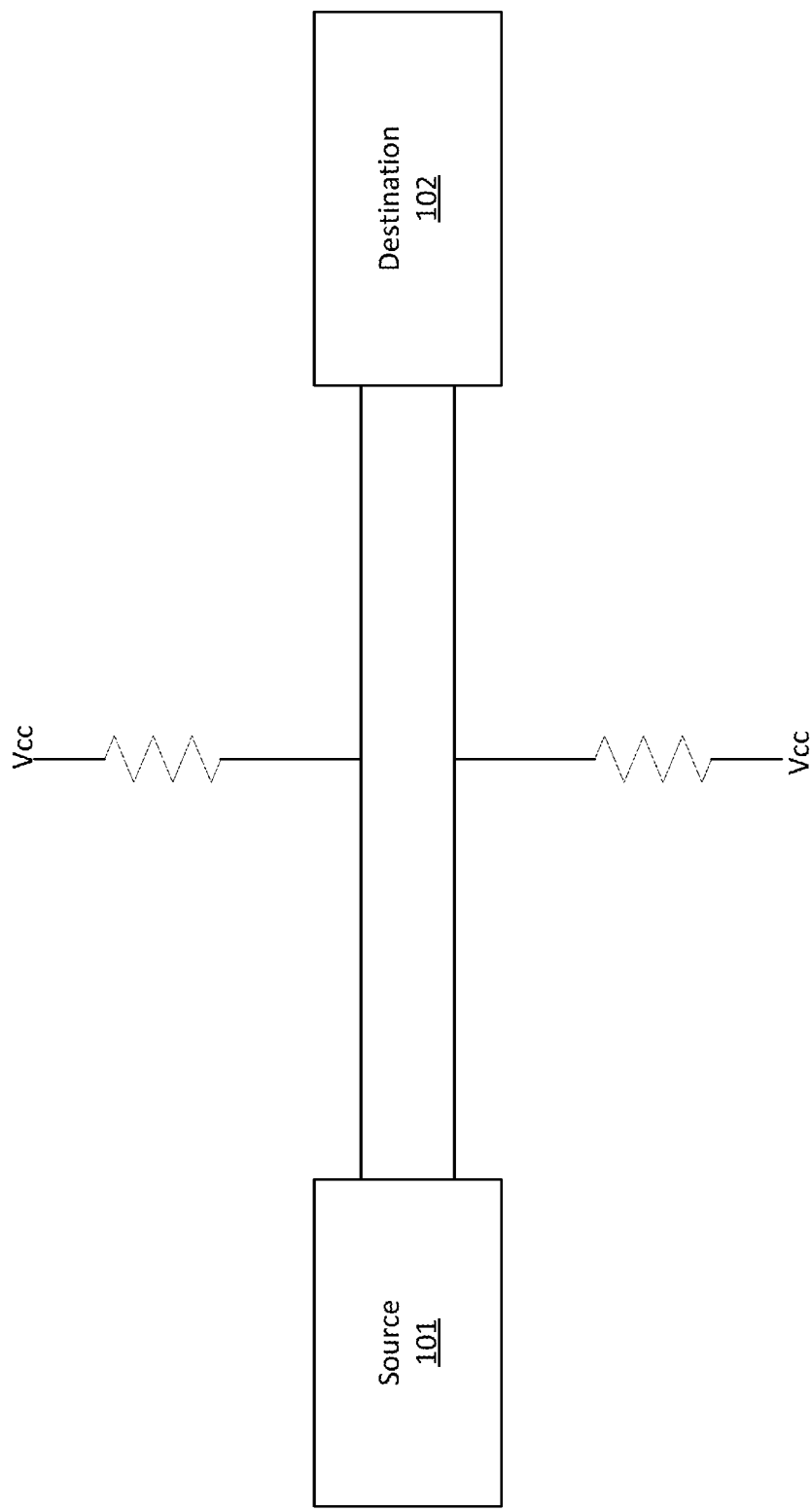
FIG. 1 is a simplified diagram illustrating connecting CML to a pair of communication line.

FIG. 1 is a simplified diagram illustrating connecting CML to a pair of communication line. For example, a set of differential lines is provided between the source 101 and the destination 102. A voltage Vcc of the CML is coupled to both of the differential lines respectively via resistors.

Figure 2:
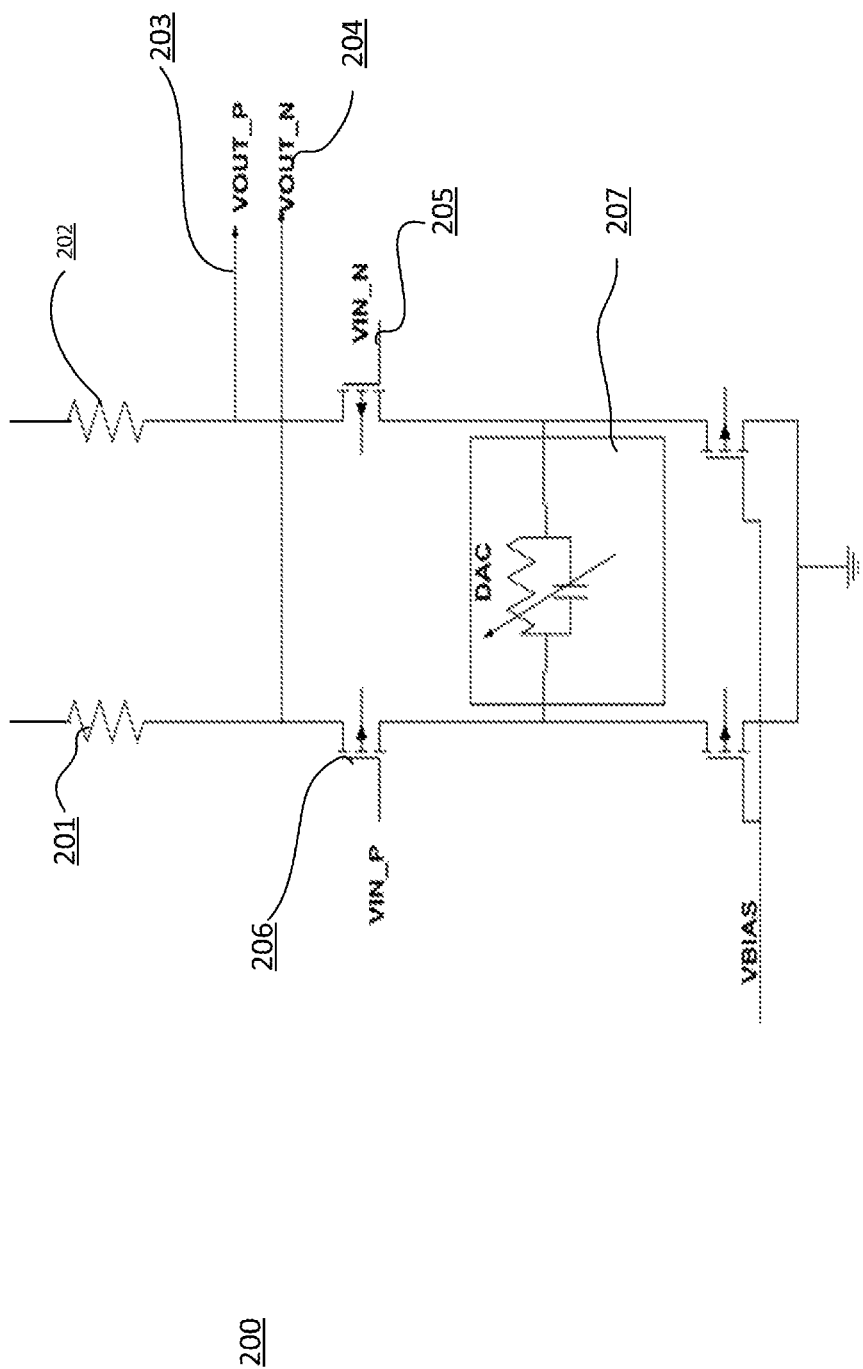
FIG. 2 is a simplified diagram illustrating a convention CML.

FIG. 2 is a simplified diagram illustrating a convention CML. As shown in FIG. 2, a pair of differential inputs Vin_P 206 and Vin_N 205 are respectively coupled to a pair of CMOS devices. A variable impedance module 207 controls a bank of capacitors and/or resistors gates. For example, by varying capacitor and/or resistor values, the source voltages of CMOS transistors can be changed, thus altering output voltages. However, as explained below, changing capacitance of the impedance module 207 would also cause a shift in peaking frequency. As shown, the outputs pair Vout_P 203 and Vout_N 204 are respectively coupled to resistors 201 and 202. For example, as shown in FIG. 1, a CML is typically coupled to communication lines with resistors.

CMLs, as mentioned above, is often used in communication lines. For example, many SerDes transceivers utilize CMLs as a part of the transmission line. Similar to other types of communication devices, Serdes transceivers often need to use one or more equalizers to compensate channel attenuation (loss). More specifically, equalization is often needed to compensate high frequency losses in communication channels. By using equalization techniques to compensate channel attenuation, effective channel length can be increased and communication channel reliability improved. Preferably, equalization technique can be adjustable to compensate channels with different levels of attenuation. For example, equalization adjustment may be manual or automatic. For example, various types of linear and adaptive equalization techniques have been used. Often, automatic adjustment is referred to as "adaptive equalization". In communication systems and SerDes, various types of linear and adaptive equalization techniques have been used.

An important aspect of providing equalization is applying equalization to communication channels. Among other things, designing a high bandwidth high gain EQ is challenging. Various equalization designs come with their power and/or area penalties. For example, a common approach involves adding inductors for gain peaking, but unfortunately this approach can only provide a fixed level of equalization, and it comes with a significant area penalty. In some conventional systems, equalization is provide by amplifiers with controllable degeneration and inductive gain peaking, and this approach provides controllable levels of equalization, but unfortunately adds significant power and area penalties.

It is to thus to be appreciated that embodiments of the present invention provide CMLs that are capable of applying adjustable equalization. Among other things, by applying equalization through CMLs, energy efficient and high performance equalization can be achieved. For example, CMLs equalization can be applied without incurring a large amount of power consumption. As described below, CMLs according to embodiments of the present invention comprise one or more transformers on their respective load stages, and these transformers function as tuned bandwidth boosters. It is to be appreciated that controlling the peaking of the inductor from the secondary winding reduces the component parasitic and power consumption. With transformer(s) as a load to CMLs, continuous time linear equalization (CTLE) can be applied. CMLs according to embodiments of the present invention are described in further details below.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 3:
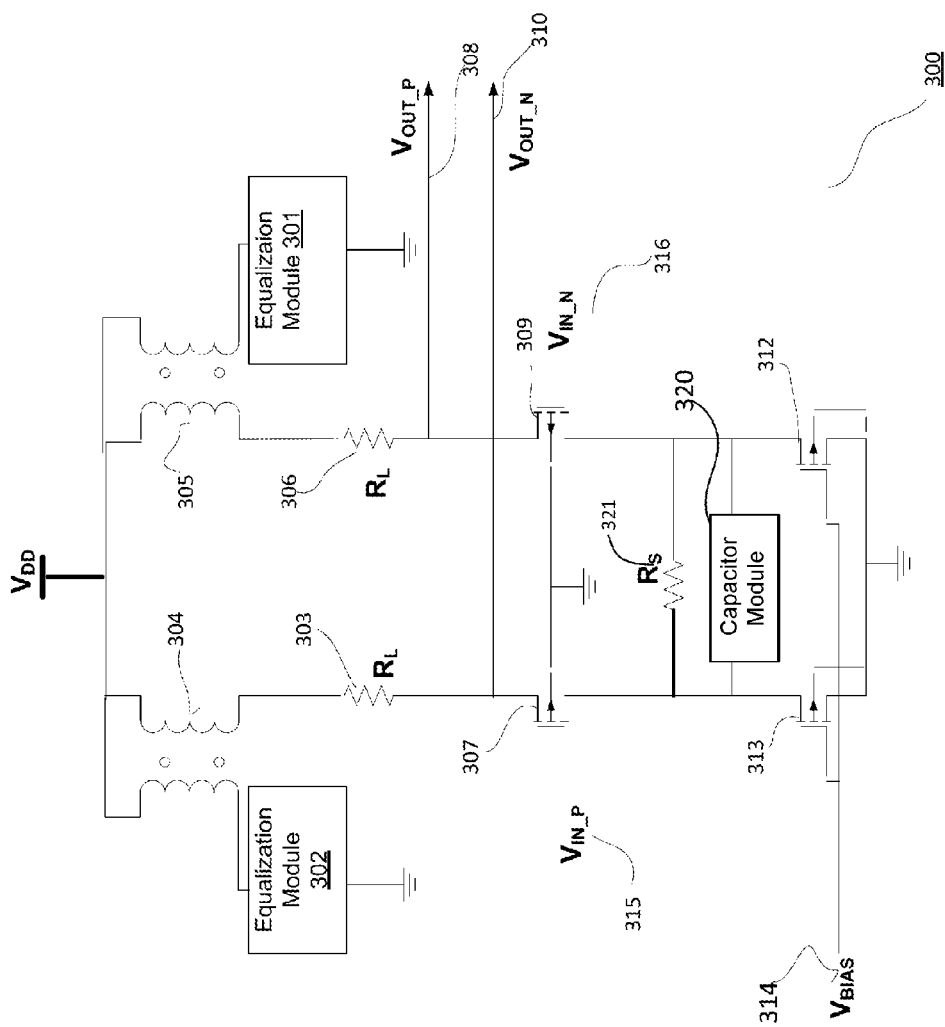
FIG. 3 is simplified diagram illustrating a CML according to an embodiment of the present invention.

FIG. 3 is simplified diagram illustrating a CML according to an embodiment of the present invention. This diagram is merely an example, which should not unduly limit the scope of the claims. One of ordinary skill in the art would recognize many variations, alternatives, and modifications. A current mode logic device 300, as shown in FIG. 3, includes a first input 315 (Vin_p) and a second input 316 (Vin_n) for receiving data. For example, the first input 315 and the second 316 are coupled to a pair of data transmission lines. The first input 315 and the second input 316 are respectively coupled to the gates of transistors 307 and 316. It is to be understood that while MOS devices are shown as transistors, other types of transistor devices may be used as well, such as bipolar junction transistor (BJT) devices uses in early implementation of CMLs, and other types of transistor devices. While operating under similar operating principles, MOS or CMOS devices are preferred over BJT devices for their high speed and low voltage. Each of the transistors 307 and 316 comprises a drain terminal and a source terminal. The drain terminals of the transistors 307 and the 316 respectively provide a first output (Vout_n) 310 and a second output (Vout_p) 308. The outputs 310 and 308, as can be seen in FIG. 3, are configured in series with resistors and transformers, and thus the output voltages are affected by the characteristics (e.g., resistance and inductance) of the resistors and transformers. The source terminals of the transistors 307 and 316 are grounded via transistors 312 and 313, which are controlled by the bias voltage 314. Source resistor 321 and adjustable capacitance 320 are configured in parallel, and are respectively coupled to the source terminals of the transistors 307 and 309.

As shown in FIG. 3, output 310 is coupled to resistor 303 and transformer 304 in series; output 308 is coupled to the resistor 306 and transformer 305 in series. Through the resistors and transformers, outputs 310 and 308 are connected to the high potential $V_{DD}$. Therefore, the voltage swing of the outputs 310 and 308 is a function of the high potential $V_{DD}$ and the resistors and the transformers. Additionally, voltage swing is affected by the tail current $I_{SS}$ coupled to the source terminals of the transistors 315 and 316. The inductances of the transformers 304 and 305 can be adjusted by equalization modules 302 and/or 303. In FIG. 3, the resistors 303 and 306 are directly coupled to the outputs 310 and 308, and the transformers 304 and 305 are coupled to the outputs via these resistors. It is to be appreciated that, depending on the implementation, the configuration of resistors, transformers, and outputs may be changed. For example, transformer 304 and the resistor 303 may switch their places, where the resistor 303 is directly coupled to the high potential $V_{DD}$, and transformer 304 is directly coupled to the output 310 and the configured in series with the resistor 303. There can be other variations as well.

Transformers 304 and 305 are characterized by adjustable inductance values. When the inductance values of the transformers 304 and 305 are changed, the voltages of the outputs 310 and 308 change correspondingly. Transformers 304 and 305, implemented in conjunction with equalizer modules 302 and 301, allow equalization to be applied to the outputs 310 and 308. Depending on the specific implementation, one or more equalization modules are used. In FIG. 3, transformers 304 and 305 are respectively connected to two different equalizer modules. In a specific implementation, only transformer 304 is connected to the equalizer module 302, and transformer 305 is not connected to an equalizer module. In another implementation, only transformer 305 is connected to the equalizer module 301, and transformer 304 is not connected to an equalizer module. It is to be appreciated that other variations as possible as well.

Each of the transformers comprises a primary winding and a secondary winding. The equalization modules are coupled to the transformers via the secondary windings of the transformers. For example, the equalizer module 302 is coupled to the secondary winding of the transformer 304, and the equalizer module 301 is coupled to the secondary winding of the transformer 305. By changing electrical characteristics (e.g., resistance and/or capacitance) of the equalizer modules, the inductances of the transformers can be changed, which in turn changes the output voltages. For example, the transformers act substantially as an adjustable load that affects the data outputs of the CMLs.

Figure 4A:
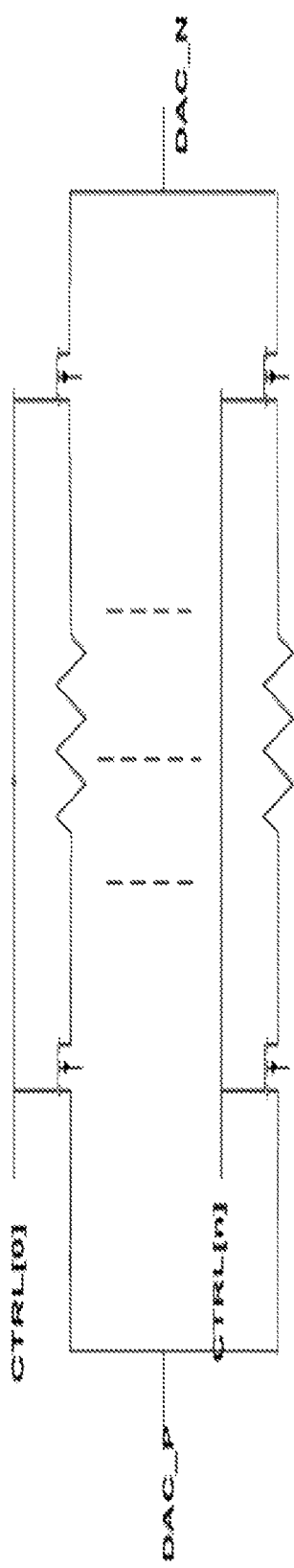
FIGS. 4A and 4B are simplified diagrams illustrating equalization modules according to embodiments of the present invention.
Figure 4B:
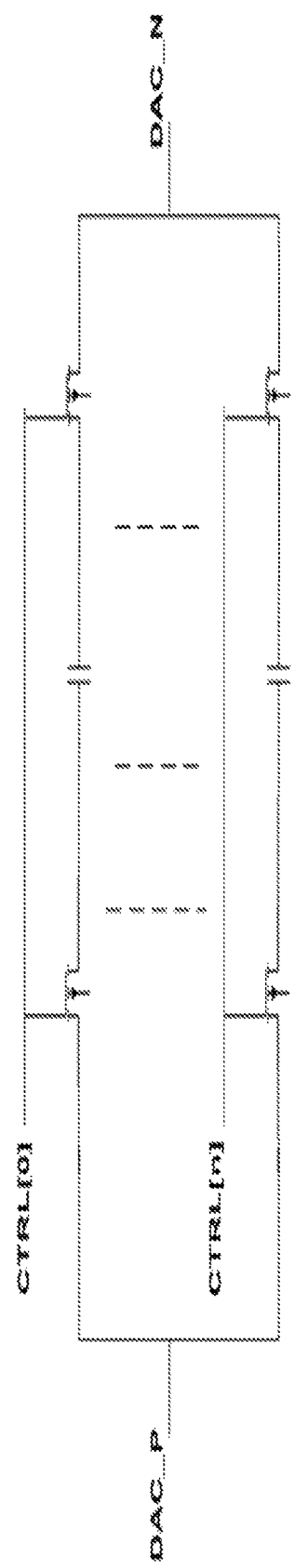

FIGS. 4A and 4B are simplified diagrams illustrating equalizer modules according to embodiments of the present invention. These diagrams merely provide an example, which should not unduly limit the scope of the claims. One of ordinary skill in the art would recognize many variations, alternatives, and modifications. As shown in FIG. 4A, a bank of resistors is switched by n control bits provided by a DAC module. The DAC module is connected to an equalization logic. For example, the equalization logic can be a DFE or other types of adaptive equalization logic. Based on the signals from the equalization logic, one or more of the resistors are turned on. As shown in FIG. 4B, a bank of capacitors is switched by n control bits provided by a DAC module. Based on the signals from the equalization logic, one or more of the capacitors are turned on. In certain embodiments, an equalization module may include both capacitors and resistors that are selectively switched by one or more DAC modules. In various implementations, the equalization logic may be adaptive equalizer (e.g., DFE equalizer), linear equalizer, and/or other types of equalizers. As explained above, the equalization modules and transformers described according to embodiments of the present invention allow equalization to be applied at CMLs, and they can be used in conjunction with different equalization systems and methods.

In various embodiments, the resistor and capacitor values are predetermined and/or calibrated based on the equalization needs. More specifically, the resistor and capacitor values and the corresponding switching by the DAC is set based on the peaking required for the equalizer. In a specific embodiment, the DAC is 5-bits (e.g., $2^5$=32 steps) and covers a range of 16 dB of peaking, at a step of 0.5 dB. Depending on the implementation, DAC at different resolution may be used. For example, for an equalization scheme that requires fine tuning equalization amount, an 8-bit DAC (i.e., capable of $2^8$=256 steps) may be used; for an equalization scheme that requires small device area and low power consumption, a 3-bit (i.e., capable of $2^3$=8 steps) DAC can be used.

In various embodiments according to the present invention, an equalization module utilizes both resistors and capacitors, and the DAC is programmed to selected predetermined combinations of resistor and capacitor. For example, for high-speed boost change, the equalization module switches only capacitors.

Now referring back to FIG. 3. As shown, equalization modules applies equalization via the secondary windings (i.e., secondary paths) of the transformers, not directly to the outputs or the data path. Consequently, component parasitic and power consumption attributing to the equalization module are minimized. In addition, the transformers 304 and 305 substantially eliminate the need for switched inductors, which are typically expensive in power and area.

The source terminals of the transistors 307 and 309 are respectively coupled to transistors 313 and 312 as shown. Transistors 313 and 312 as shown are independently biased by a bias voltage $V_{BIAS}$, which is electrically coupled to their respective gate terminals. Resistor 321 and the capacitor module 320 are configured in series and electrically coupled to the source terminals of transistors 307 and 309. Resistor 321 and the capacitor module 320 are associated with the tail currents coming out of the transistors 307 and 309. The electrical properties of resistor 321 and the capacitor module 320 consequently affect the magnitude of the tail currents, which in turn affect the voltage swing magnitude. The capacitor module 320 provides an adjustable capacitance. For example, the capacitor module 320 is implemented according to FIG. 4B, where a bank of capacitors is switched by n control bits provided by a DAC module. Based on the signals from the equalization logic, one or more of the capacitors are turned on. By changing the capacitance of the capacitor module 320, the CML outputs 308 and 310 can be changed as well. In various embodiments, the change of capacitance of the capacitor module 320 is coordinated with equalization module 302 and/or equalization module 301. For example, selection of capacitors and/or resistors of equalization modules is coordinated against the selection of capacitors at the capacitor module 320, wherein capacitors and resistors values are predetermined and matched accordingly. By changing both inductance coupled to the outputs and capacitance coupled to the tail currents, the system is capable of adjusting the output voltage levels without causing a shift in frequency.

Figure 5:
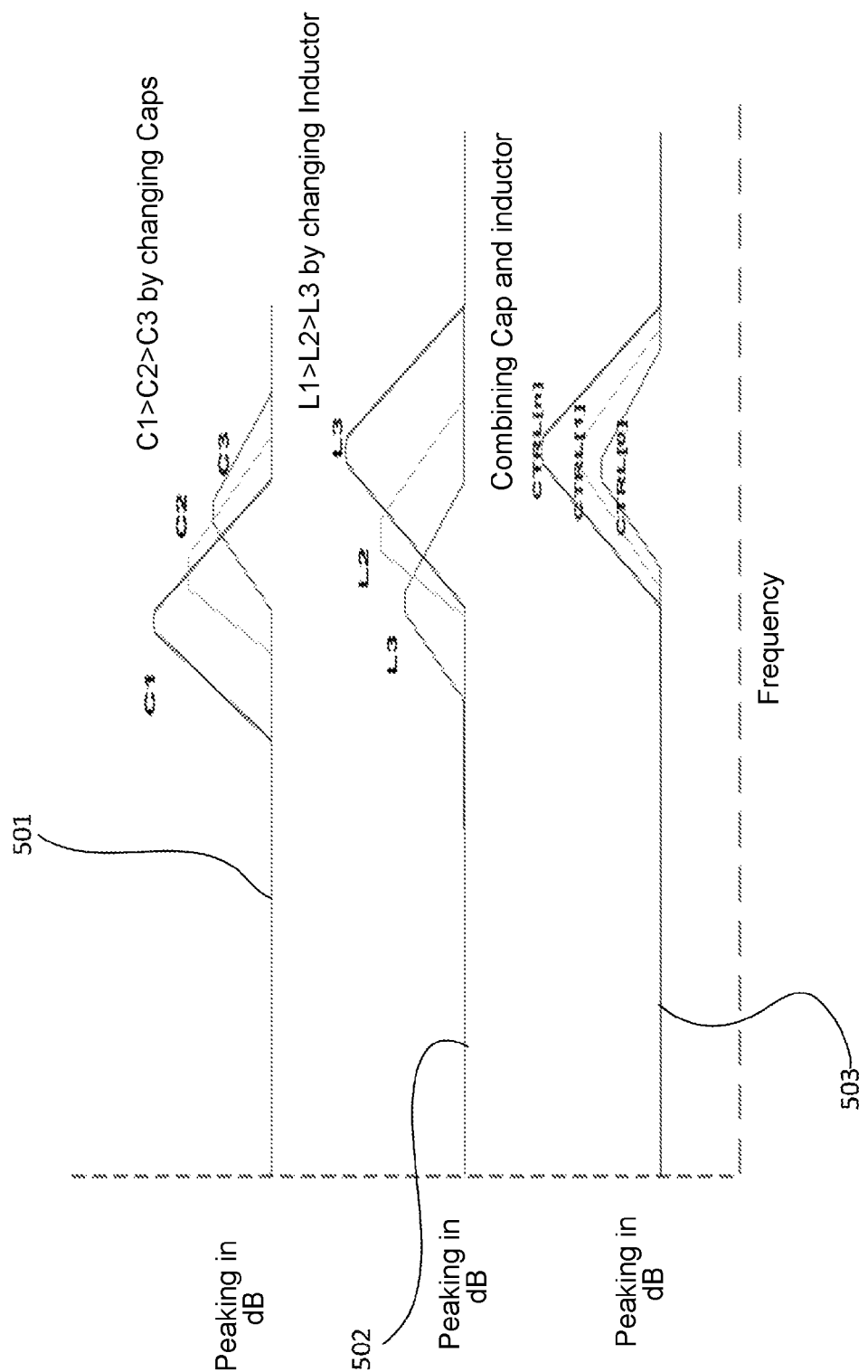
FIG. 5 is a simplified diagram illustrating equalization applied to an output data line.

It is to be appreciated that the CMLs according to embodiments of the present invention can provide equalization at specific target peaking frequencies. FIG. 5 is a simplified diagram illustrating equalization applied to an output data line. This diagram is merely an example, which should not unduly limit the scope of the claims. One of ordinary skill in the art would recognize many variations, alternatives, and modifications. As shown in graph 501, by increasing capacitance, peaking is increased, but at the same time the peaking is shifted to a lower frequency. For example, if the original signal is at a capacitance C3, by increasing capacitance to C2, peaking is increased, and frequency is shifted lower; by further increasing capacitance to C1, peaking is further increased, and frequency is further lowered. For example, frequency shift shown in graph 501 may occur when the capacitor module 320 shown in FIG. 3 is used alone to change the peaking magnitude.

Changing inductance also affect both peaking and frequency. As shown in graph 502, when inductance is increased from L3 to L2, both peaking and frequency are increased, and when inductance is increased to L1, both peaking and frequency are further increased. For example, frequency shift shown in graph 502 may occur when equalization modules 301 and/or 302 alone, without adjusting the capacitor module 320, are used to change the peaking magnitude.

For the purpose of applying equalization, frequency shift is undesirable. It is thus to be appreciated that embodiments of the present invention allow equalization to be applied without shifting frequency, as shown in graph 503. As can be seen in graph 503, by adjusting both capacitance (through capacitor module coupled to the source terminals of the transistors) and inductance (through transformers coupled to the drain terminals of the transistors), the changes in peaking magnitude can be adjusted without causing frequency shift. For example, when the DAC is at a value of [0], the peaking magnitude is relatively low; however, when DAC is at value [1] or [n], which correspond to different combinations of the capacitors and/or resistors being selected, the corresponding peaking magnitudes are increased, but the peaking frequencies stayed the same.

Figure 6:
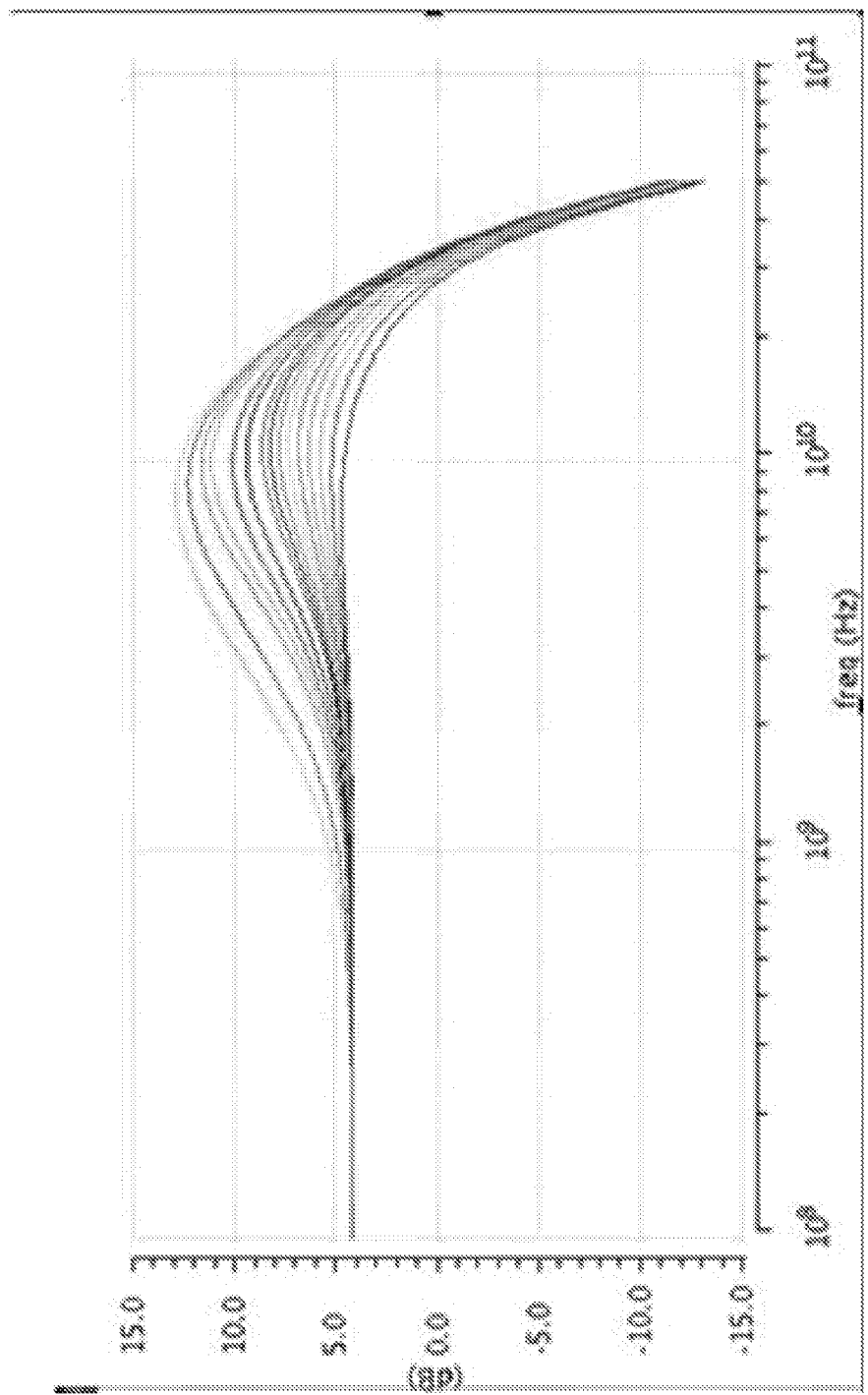
FIG. 6 is a graph illustrating simulation of applying equalization at different settings of an equalization module according to an embodiment of the present invention.

FIG. 6 is a graph illustrating simulation of applying equalization at different settings of an equalization module according to an embodiment of the present invention. This diagram is merely an example, which should not unduly limit the scope of the claims. One of ordinary skill in the art would recognize many variations, alternatives, and modifications. As can be seen in FIG. 6, at different equalization peaking values (e.g., from 0 to about 15 dB), peaking frequencies stay centred. For example, both the capacitor module coupled to the tail current and the equalization module coupled to the output are adjusted to provide equalization without shifting the peaking frequency.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A communication system comprising:
   a pair of differential input terminals, the pair of differential input terminals comprising a first input and a second input for receiving data;
   a current mode logic device comprising:
      a first transistor comprising a first gate and a first output terminal and a first source terminal, the first gate being electrically coupled to the first input;
      a second transistor comprising a second gate and a second output terminal, the second gate being electrically coupled to the second input;
      a capacitor module coupled to the first source terminal;
      a first resistor coupled to the first output terminal;

a second resistor coupled to the second output terminal;

a first transformer comprising a first primary winding and a first secondary winding, the first primary winding being electrically coupled to the first resistor and the first output terminal; and a first equalization module coupled to the first secondary winding, the first equalization module comprising a first digital-to-analog converter (DAC) unit, the DAC unit being configure to adjust an impedance value of the first equalization module in response to an equalization signal; and a SerDes device being coupled to the first output terminal.

2. The system of claim 1 wherein the first equalization module further comprises a plurality of capacitors switched by the first DAC.

3. The system of claim 1 wherein the first equalization module further comprises a plurality of resistors switched by the first DAC.

4. The system of claim 1 further comprising a second transformer, the second transformer comprising a second primary winding and a second secondary winding.

5. The system of claim 4 further comprising a second equalization module coupled to the second secondary winding, wherein the second equalization module comprises a second DAC unit and a second plurality of resistors.

6. The system of claim 1 wherein the capacitor module comprises a second DAC unit and a plurality of capacitors, the plurality of capacitors being switched based on control signals of the second DAC unit.

7. The system of claim 1 wherein the first equalization module is coupled to a decision feedback equalization module.

8. The system of claim 1 wherein the first equalization module comprises a plurality of resistors and a plurality of capacitors.

9. A method for equalizing signals using a common-mode logic (CML) device, the method comprising:

receiving a pair of differential input signals using a pair of input transistors, the pair of input transistors including a first transistor, the first transistor including a first source terminal and a first drain terminal;

receiving a bias control signal;

configuring a capacitor module using at least the bias control signal, the capacitor module being coupled to the first source terminal;

receiving a first equalization signal;

adjusting a first peaking level of a first equalizer module using the first equalization signal;

adjusting a first inductance value of a first transformer using the first equalizer module, the first transformer being coupled to a first output load; and generating a first output signal based at least on the different input signal and first inductance value of the first transformer, the first output signal being coupled to the first drain terminal.

10. The method of claim 9 further comprising generating the first equalization signal using a decision feedback equalization.

11. The method of claim 9 further comprising selectively switching a plurality of capacitors using the bias control signal, the capacitor module comprising the plurality of capacitors.

12. The method of claim 9 further comprising:

receiving a second equalization signal;

adjusting a second peak level of a second equalizer module using the second equalization signal;

adjusting a second inductance value of a second transformer using the second equalizer module.

13. The method of claim 9 further comprising selectively switch a plurality of resistors using the first equalization signal, the first equalizer module comprising the plurality of resistors.

14. The method of claim 9 further comprising selectively switch a plurality of capacitors using the first equalization signal, the first equalizer module comprising the plurality of capacitors.

15. The method of claim 9 further comprising converting the first equalization signal from a digital code to an analog signal using a DAC.

16. A method for equalizing signals using a common-mode logic (CML) device, the method comprising:

receiving a pair of differential input signals using a pair of input transistors, the pair of input transistors including a first transistor, the first transistor including a first source terminal and a first drain terminal;

receiving a bias control signal;

configuring a capacitor module using at least the bias control signal, the capacitor module being coupled to a first source terminal;

receiving the first equalization signal;

converting the equalization signal to a plurality of control bits using a DAC;

providing an equalization module, the equalization module comprising a plurality of resistors and being coupled to a transformer;

switching the plurality of resistors using the plurality of control bits;

generating a first output signal based at least on the different input signal and first inductance value of the transformer, the first output signal being coupled to the first drain terminal.

17. The method of claim 16 further comprising switching a plurality of capacitors using the plurality of control bits.

18. The method of claim 16 further comprising adjusting an inductance value of the transformer.

19. The method of claim 16 wherein the transformer is coupled to a load resistor.

20. The method of claim 16 further comprising converting the bias control signal to a plurality of control bits.

* * * * *